United States Patent [19]

Uchida

[11] 4,095,334

[45] Jun. 20, 1978

[54] PROCESS OF ASSEMBLING COMPONENTS OF ELECTRONIC WATCH

[75] Inventor: Masataka Uchida, Tokyo, Japan

[73] Assignee: Kabushiki Kaisha Daini Seikosha, Japan

[21] Appl. No.: 763,597

[22] Filed: Jan. 28, 1977

[30] Foreign Application Priority Data

Jan. 29, 1976 Japan .................................... 51-8658

[51] Int. Cl.[2] .......................... G04C 3/00; H05K 5/00

[52] U.S. Cl. .................................... 29/627; 58/23 BA

[58] Field of Search .............. 29/627, 626; 58/23 BA, 58/23 R, 50 R, 88 C; 174/68.5

[56] References Cited

U.S. PATENT DOCUMENTS

| | | | |
|---|---|---|---|
| 3,838,568 | 10/1974 | Zurcher | 58/88 C |
| 3,986,335 | 10/1976 | Harper | 58/50 R |
| 4,012,579 | 3/1977 | Fox | 29/627 X |

*Primary Examiner*—Milton S. Mehr

*Attorney, Agent, or Firm*—Robert E. Burns; Emmanuel J. Lobato; Bruce L. Adams

[57] ABSTRACT

In making an electronic watch, a substrate of insulating material is provided on one or both faces with metal foil defining circuitry. An IC chip is mounted in a recess in the substrate, connected with the circuitry and covered with potting material. The substrate is then sandwiched between two synthetic plates which are connected with one another and with the substrate by pins extending through holes in the substrate.

4 Claims, 3 Drawing Figures

PROCESS OF ASSEMBLING COMPONENTS OF ELECTRONIC WATCH

FIELD OF THE INVENTION

The present invention relates to manufacturing electronic watches and in particular to assembling components of an electronic watch in an expeditious and economical manner.

BACKGROUND OF THE INVENTION

Conventionally in the manufacture of an electronic watch, an integrated circuit chip (hereinafter referred as an IC chip) is mounted on a lead frame such as KOVAR (trademark) and is then molded in epoxy resin. Thereafter the molded IC chip is soldered onto a substrate which is then secured on a metal base or frame of the electronic watch. This method, however, is disadvantageous with respect to cost since the IC chip is soldered onto the substrate after molding through a separate process. It is also disadvantageous with respect to space since the construction does not lend itself to making a small wrist watch.

In another method of assembly, a substrate for an electronic timepiece is made by the following process: An IC chip is mounted in a recess of a substrate of insulating material having thereon metal foil in a pattern to define circuitry. The substrate with the IC chip thereon is then molded into a frame by a transfer molding process. As the molding cycle of transfer molding is long and the productivity is low, the cost of manufacture by this process is correspondingly high. Moreover the cost is further increased by the need of using a metallic mold.

SUMMARY OF INVENTION

It is an object of the present invention to eliminate the above mentioned disadvantages and to provide a process of assembling components of an electronic watch at low cost.

In accordance with the present invention an IC chip and a quartz crystal oscillating element are mounted on a circuit board comprising a substrate of insulating material with conductive circuit defined on one or both faces by metal foil. The IC chip and quartz crystal oscillating element are electrically connected to the circuitry of the circuit board and the IC chip is covered with potting material which provides an effective seal. As the crystal oscillator is canned in a discrete housing, it does not need to be covered with potting material. The circuit board with the IC chip and a crystal oscillator thereon is then sandwiched between two plates of synethetic resin material which are separately molded and are designed to provide a frame with recesses for receiving a display panel and a power cell. Through the process of the present invention substantial economies can be effected in the cost of manufacturing electronic watches.

BRIEF DESCRIPTION OF DRAWINGS

The nature, objects and advantages of invention and the distinctions between the process of the invention and the prior art will be more fully understood from the following description in conjunction with the accompanying drawings in which.

DESCRIPTION OF PRIOR ART

Figure 1:
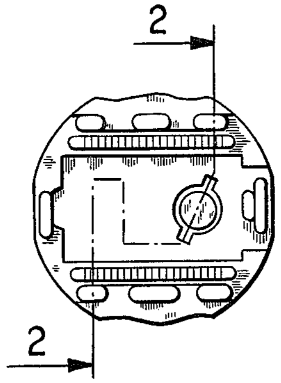
FIG. 1 PRIOR ART
FIG. 1 is a plan view illustrating the mounting process of the conventional substrate of an electronic watch.
Figure 2:
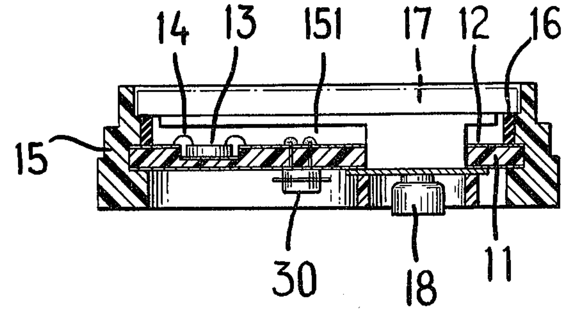
FIG. 2 PRIOR ART
FIG. 2 is a sectional view taken along the line 2—2 in FIG. 1.

FIGS. 1 and 2 illustrate a conventional process for mounting the components of an electronic watch. The process comprises the following steps: A substrate 11 made of insulating material such as glass, epoxy resin or the like is provided on one or both faces with a circuit pattern 12 of copper foil or the like. An IC chip 13 is mounted in a recessed portion of the substrate 11 and is connected by fine metal wires 14 with the circuit pattern 12 on the substrate. The substrate 11 with the circuit pattern 12 and the IC chip 13 thereon is then placed in a mold and thermosetting resin 15 is molded on and around the substrate by a transfer molding process to constitute the frame for the electronic watch. In the transfer molding process spaces are formed for a display panel 17, conductive rubber connector 16 between the display panel 17 and the circuit pattern 12 of the substrate 11 and for a battery 18. Coincidently a portion 151 is formed to seal the IC chip. Because of the cost and the low productivity of transfer molding this process of assembly is relatively costly.

DESCRIPTION OF PREFERRED EMBODIMENT

Figure 3:
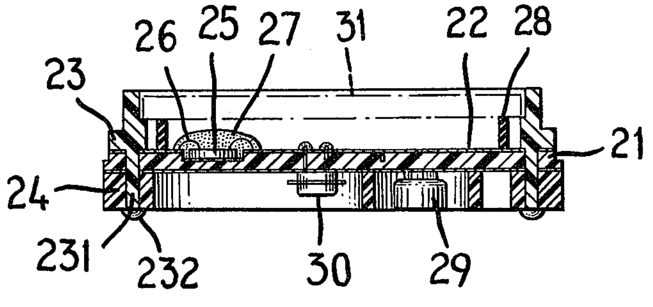
FIG. 3 is a sectional view illustrating the process of the present invention.

A preferred embodiment of the process in accordance with the present invention is illustrated in FIG. 3. In the process of the present invention a substrate 21 made of insulating material such as glass, epoxy thermosetting resin, or the like is provided on one or both faces with a circuit pattern 22 formed for example of copper foil so as to provide a circuit board. An IC chip 25 is mounted in a recess on one face of the substrate 21 and is electrically connected with the circuit pattern 22 on the substrate by fine metal wires 26. A quartz crystal oscillating element 30 is likewise mounted on the substrate 21 and is electrically connected with the circuitry thereon. The IC chip 25 together with the connecting wires 26 are then sealed in with a suitable potting compound 27. As the crystal oscillating element is formed with a canned discrete housing, there is no need of its being covered with potting compound.

The substrate 21 with the circuit pattern 22, the IC chip 25 and oscillator 30 thereon is then sandwiched between the two plates or frame members 23 and 24 which are separately molded by an injection molding process. The frame members 23 and 24 are connected with one another and with the substrate 21 by cylindrical pin portions 231 on member 23 which extend through aligned holes in the substrate 21 and member 24 whereupon protruding portions 232 are formed as heads to secure the parts in assembled condition. The frame member 23 provides spaces for receiving a display panel 31 and for rubber connecting blocks 28 providing electrical connections between the display panel and the circuit pattern 22 on the substrate 21. The member 24 is provided with a space to receive a power cell 29.

By the process according to the present invention the lead frame (not shown) of the conventional mounting process is eliminated and the soldering process to the substrate becomes unnecessary with the result that the reliability becomes greater. Moreover the present invention solves the problem of bad contact experienced with the conventional mounting process caused by the flow of thermosetting resin onto portions of the circuit pattern 12 which are to be engaged by the rubber connectors 16 for connection to the display panel. Also since the cycle time of molding by injection molding is shorter than the transfer molding time the productivity becomes higher and the cost of the mold has less influence on the total cost of production. Thus an economical and inexpensive assembly for electronic watch can be provided.

While a preferred embodiment of the invention has been illustrated in the drawings and is herein particularly described it will be understood that many variations and modifications can be made and that the invention is thus in no way limited to the illustrated embodiment.

What I claim is:

1. In a process of making an electronic watch, the combination of steps comprising:

providing a substrate of insulating material with at least one through hole, providing a conductive circuit on at least one face of said substrate to form a circuit board, mounting an integrated circuit chip on one face of said circuit board, electrically connecting the integrated circuit of said chip with the circuit of said circuit board, covering said chip and its connection to said circuit board with an insulating potting material, separately forming two plates of synthetic resin material, sandwiching said circuit board between said plates and connecting said plates and circuit board through said through hole to form a unitary assembly.

2. A process according to claim 1 in which a recess is formed on one side of said substrate to receive said chip which is mounted in said recess.

3. A process according to claim 1, in which said substrate is provided with a plurality of said through holes near its periphery and in which one of said plates is formed with a corresponding plurality of pins which extend through said holes in said substrate and aligned holes in the other of said plates and are headed to connect said plates and said substrate therebetween.

4. A process according to claim 1, in which one of said plates is formed with spaces for receiving a display panel and connecting blocks providing electrical connections between said display panel and said conductive circuit on said substrate.

* * * * *